United States Patent
Kawakami

(10) Patent No.: US 8,734,701 B2
(45) Date of Patent: May 27, 2014

(54) IMPRINT APPARATUS AND METHOD OF MANUFACTURING ARTICLE

(75) Inventor: Eigo Kawakami, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 170 days.

(21) Appl. No.: 12/816,881

(22) Filed: Jun. 16, 2010

(65) Prior Publication Data

US 2010/0314798 A1 Dec. 16, 2010

(30) Foreign Application Priority Data

Jun. 16, 2009 (JP) ................. 2009-143670

(51) Int. Cl.
*B28B 11/08* (2006.01)

(52) U.S. Cl.
USPC ........... 264/293; 425/385; 425/169; 425/174; 425/174.4

(58) Field of Classification Search
USPC ............... 425/385, 174, 174.4, 169; 264/293
See application file for complete search history.

(56) References Cited

U.S. PATENT DOCUMENTS

| | | | |
|---|---|---|---|
| 5,798,830 A * | 8/1998 | Srinivasan | 356/237.2 |
| 6,900,881 B2 | 5/2005 | Sreenivasan et al. | |
| 7,019,835 B2 | 3/2006 | McMackin et al. | |
| 2004/0009673 A1 * | 1/2004 | Sreenivasan et al. | 438/694 |
| 2006/0192320 A1 * | 8/2006 | Tokita et al. | 264/293 |
| 2007/0018360 A1 * | 1/2007 | Kolesnychenko et al. | 264/407 |
| 2007/0134362 A1 * | 6/2007 | Heidari | 425/385 |
| 2007/0145639 A1 | 6/2007 | Seki et al. | |

FOREIGN PATENT DOCUMENTS

| | | |
|---|---|---|
| JP | 10-336506 A | 12/1998 |
| JP | 2000-187008 A | 7/2000 |
| JP | 2005-533393 T | 11/2005 |
| JP | 3811728 B2 | 8/2006 |
| JP | 2007-137051 A | 6/2007 |
| JP | 2007-523492 T | 8/2007 |
| JP | 2008-116272 A | 5/2008 |
| JP | 2008-164593 A | 7/2008 |
| JP | 2008-276919 A | 11/2008 |
| JP | 2010-239009 A | 10/2010 |
| TW | I250276 B | 3/2006 |

OTHER PUBLICATIONS

Office Action issued in corresponding Japanese Patent Application No. 2009-143670 dated Apr. 18, 2011.
TW OA issued Jun. 27, 2013 for corresponding TW 099117212.

* cited by examiner

*Primary Examiner* — Joseph S Del Sole
*Assistant Examiner* — David N Brown, II
(74) *Attorney, Agent, or Firm* — Rossi, Kimms & McDowell LLP

(57) ABSTRACT

An imprint apparatus, which performs an imprint process for forming a pattern of a mold on a resin coated on a substrate, includes an imaging unit configured to image the resin on which the pattern is formed, and a controller configured to control the imprint process. When the pattern is continuously formed on the substrate, the controller compares an image of at least a partial area imaged by the imaging unit and an image of a reference state, which is obtained in advance, and when patterns each having a difference, which falls outside an allowable range, between the images are continuously formed, it determines a transfer error.

17 Claims, 9 Drawing Sheets

F I G. 5
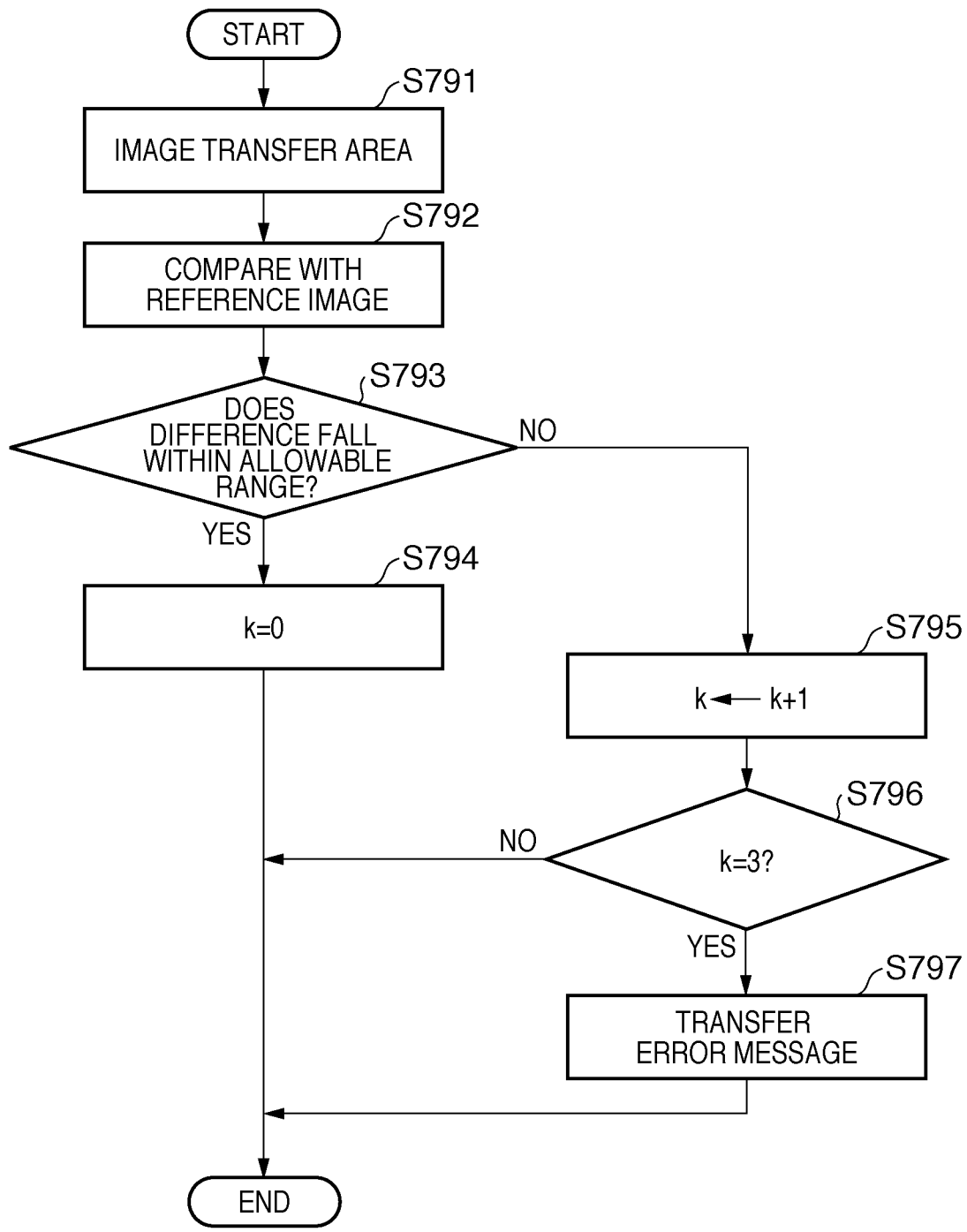

IMPRINT APPARATUS AND METHOD OF MANUFACTURING ARTICLE

BACKGROUND OF THE INVENTION

1. Field of the Invention

The present invention relates to an imprint apparatus and a method of manufacturing an article used in the imprint apparatus.

2. Description of the Related Art

An imprint technique is already known as a technique that replaces a method of forming a micro-pattern on a semiconductor device using photolithography by ultraviolet rays, X-rays, or an electron beam. The imprint technique transfers a pattern on a resin by pressing a mold formed with a micro-pattern against a substrate such as a wafer coated with a resin material. The imprint technique includes some types. As one method, a photo-curing method is proposed by PCT Publication(WO) No. 2005-533393. The photo-curing method exposes an ultraviolet-curing resin against which a transparent mold is pressed, and then removes (releases) the mold after curing. The imprint technique based on this photo-curing method is suited to the manufacture of semiconductor integrated circuits since it allows relatively easy temperature control and observation of alignment marks on a substrate via the transparent mold. In consideration of different patterns to be superposed, a step-and-repeat method, which prepares a mold to fit the size of a chip of a device to be manufactured, and sequentially transfers the patterns onto respective shots on a substrate can be applied.

In an imprint apparatus based on the photo-curing method, an uneven thickness of an ultraviolet-curing resin (to be referred to as a resin hereinafter), which is called a residual layer and is present between the substrate surface and concave bottom surface of a concave-convex pattern after pattern transfer poses a problem. This is because when the thickness of the residual layer (residual layer thickness) of the resin is uneven, the width of a convex portion of the concave-convex pattern locally changes in an etching process executed for the substrate after pattern transfer, and the line width precision of a transfer pattern is adversely affected. In the imprint apparatus, the presence of dust also poses a serious problem, and the concave-convex pattern of the mold may often be destroyed at the time of pattern transfer depending on the size and material of dust. In any case, when transfer is continuously made on shots on the substrate intact, it is not preferable since the number of defective shots merely increases. When transfer errors such as the residual layer thickness unevenness of the resin and the presence of dust are confirmed, pattern transfer has to be aborted. PCT Publication(WO) No. 2007-523492 discloses a method of checking changes between shots by comparing characteristics of a plurality of shots on a single substrate as a transfer quality determination method.

However, with the method described in PCT Publication (WO) No. 2007-523492, when shot characteristics are different for respective substrates, criteria for determining transfer qualities for respective substrates also become different, thus posing another problem. Also, with the method described in PCT Publication(WO) No. 2007-523492, since a transfer quality is determined based on changes between shots, the quality of the first shot cannot be determined.

SUMMARY OF THE INVENTION

The present invention provides an imprint apparatus that can determine a quality of shaping by a mold from the first shot using common criteria.

According to the present invention, there is provided an imprint apparatus, which performs an imprint process for forming a pattern of a mold on a resin coated on a substrate, the apparatus comprising: an imaging unit configured to image the resin formed with the pattern; and a controller configured to control the imprint process, wherein when the pattern is continuously formed on the substrate, the controller compares an image of at least a partial area imaged by the imaging unit and an image of a reference state, which is obtained in advance, and when patterns each having a difference, which falls outside an allowable range, between the images are continuously formed, the controller determines a transfer error.

Further features of the present invention will become apparent from the following description of exemplary embodiments with reference to the attached drawings.

BRIEF DESCRIPTION OF THE DRAWINGS

FIG. 5 is a flowchart of a process for determining a transfer quality according to the respective embodiment;

DESCRIPTION OF THE EMBODIMENTS

An imprint apparatus according to the present invention, which forms a pattern on a substrate by performing an imprint process including shaping of a resin coated on the substrate by a mold will be described hereinafter with reference to the accompanying drawings.

[First Embodiment]

Figure 1:
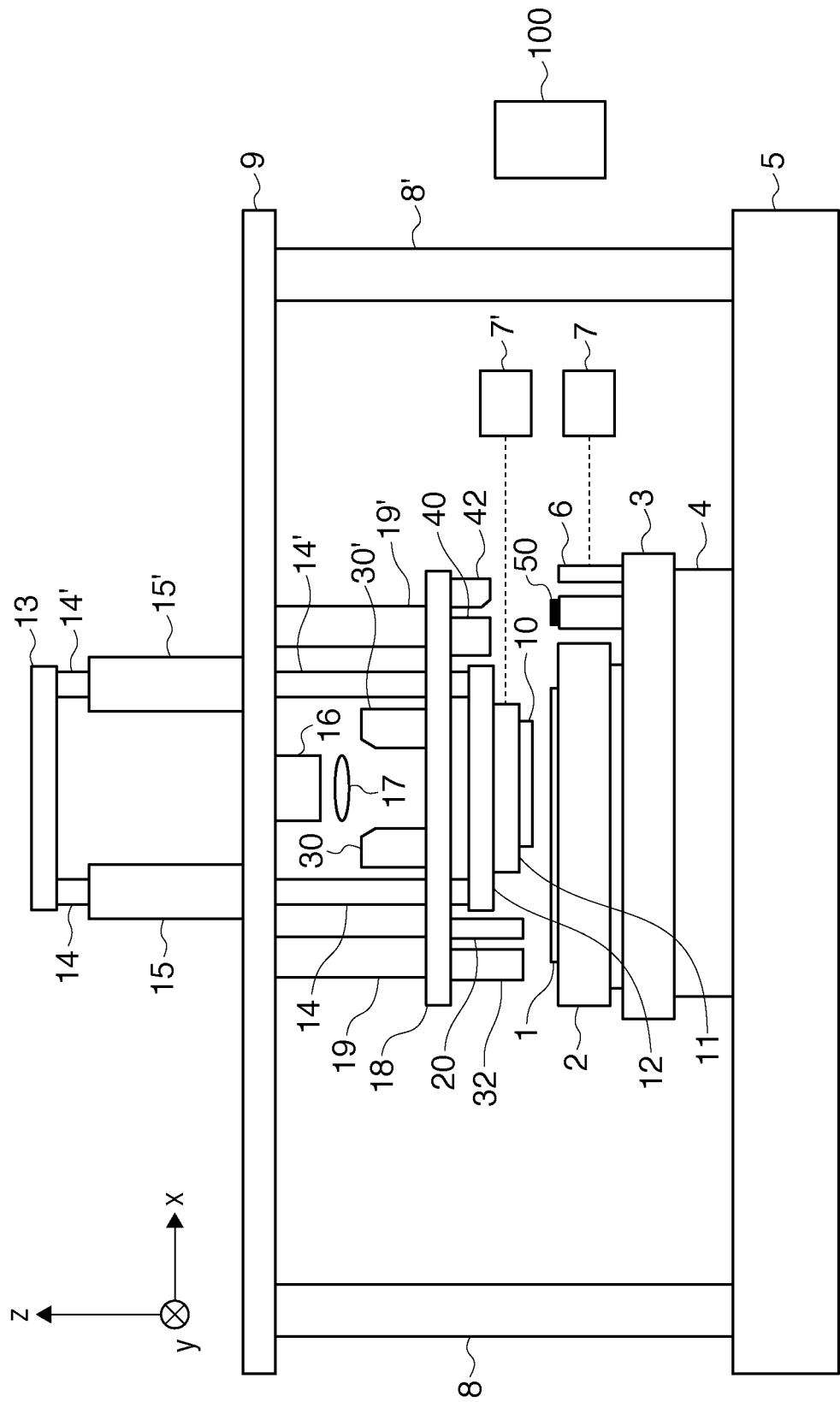
FIG. 1 is a view showing the arrangement of an imprint apparatus according to the first embodiment.
Figure 2:
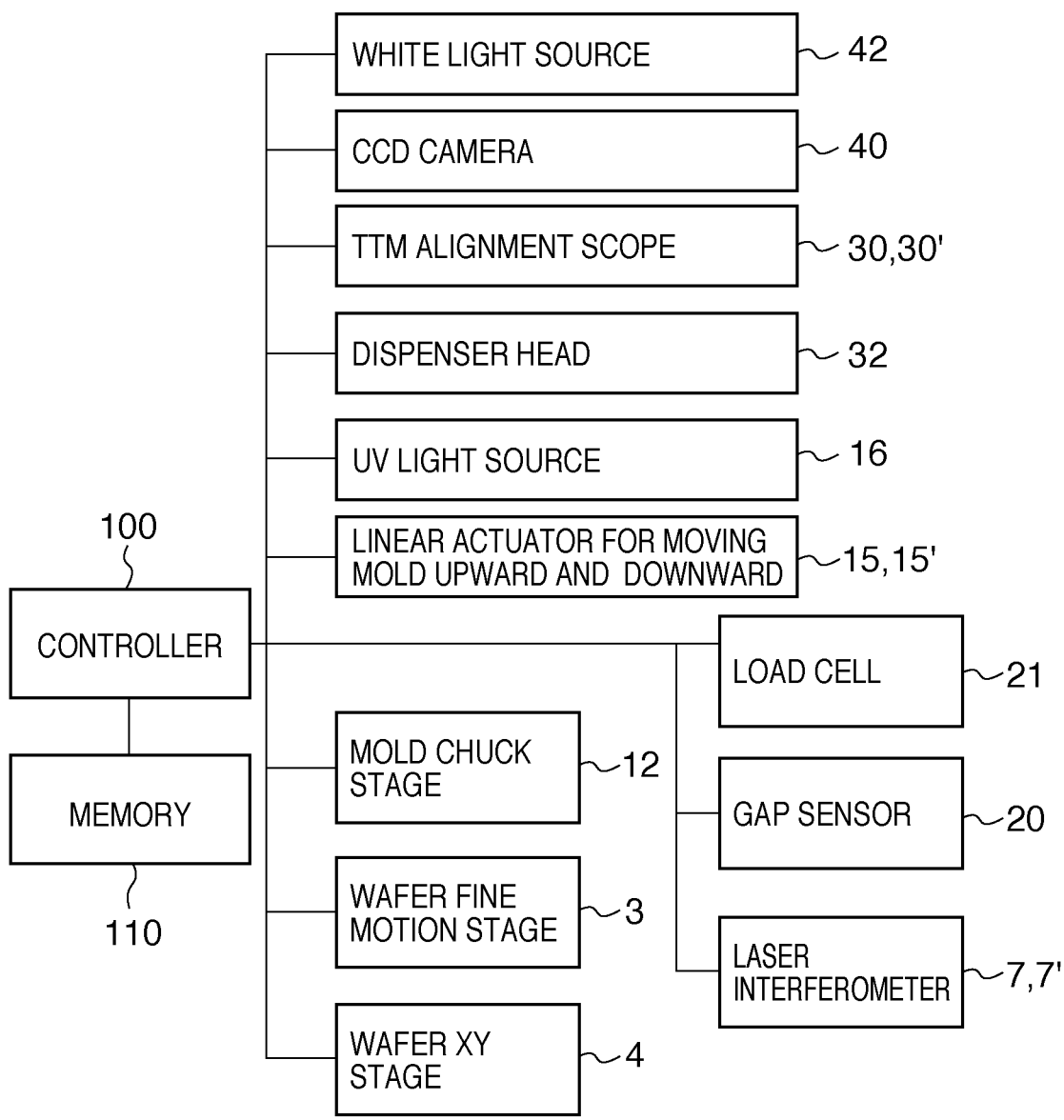
FIG. 2 is a control block diagram of an imprint apparatus according to respective embodiments.

FIG. 1 is a view showing the arrangement of an imprint apparatus according to the first embodiment, and FIG. 2 is a control block diagram of the imprint apparatus according to respective embodiments. A wafer 1 as a substrate is held on a substrate chuck (wafer chuck) 2. A fine motion stage 3 has a correction function of a position in a θ (rotation about a z-axis) direction of the wafer 1, an adjustment function of a z-position of the wafer 1, and a tilt function of correcting a tilt of the wafer 1. The fine motion stage 3 is laid out on an XY stage 4 used to align the wafer 1 to a predetermined position. A combination of the fine motion stage 3 and XY stage 4 will be generally referred to as a substrate stage (wafer stage) hereinafter. The XY stage 4 is placed on a base surface plate 5. In order to measure the position of the fine motion stage 3, a reference mirror 6 which reflects light coming from a laser interferometer 7 is attached on the fine motion stage 3 to face in x- and y-directions (that in the y-direction is not shown). Reference numerals 8 and 8' denote columns which stand on the base surface plate 5 to support a top plate 9. A concave-convex pattern to be transferred onto the wafer 1 is formed on the surface of a mold 10, which is held on a mold chuck 11 by a mechanical holding mechanism (not shown). The mold chuck 11 is placed on a mold chuck stage 12 by a mechanical holding mechanism (not shown). The mold chuck stage 12 has a correction function of positions of the mold 10 and mold chuck 11 in the θ (rotation about the z-axis) direction, and a tilt function of correcting a tilt of the mold 10. The mold chuck 11 has a reflecting surface for reflecting light coming from a laser interferometer 7' so as to measure its position in the x- and y-directions (that in the y-direction is not shown). The mold chuck 11 and mold chuck stage 12 respectively have openings that allow ultraviolet (UV) light, which comes from a UV light source 16 via a collimator lens 17, to pass through them toward the mold 10. A guide bar plate 13 fixes the other-end portions of guide bars 14 and 14', one-end portions of which are fixed to the mold chuck stage 12 and which extend through the top plate 9.

Linear actuators 15 and 15', which include air cylinders or linear motors and are used to move the mold upward and downward, drive the guide bars 14 and 14' in the z-direction in FIG. 1, so as to press the mold 10 held by the mold chuck 11 against the wafer 1 and to remove it. An alignment shelf 18 is suspended from the top plate 9 by columns 19 and 19', and the guide bars 14 and 14' extend through the alignment shelf 18. A gap sensor 20 such as a capacitance sensor measures the height (flatness) of the wafer 1 on the wafer chuck 2. A plurality of load cells 21 (not shown in FIG. 1) are attached to the mold chuck 11 or mold chuck stage 12, and measure a pressing force of the mold 10. TTM (Through-The-Mold) alignment scopes 30 and 30' for die-by-die alignment have optical systems and imaging systems used to observe alignment marks provided to the wafer 1 and mold 10. The TTM alignment scopes 30 and 30' are used to measure positional shifts in the x- and y-directions between the wafer 1 and mold 10. A dispenser head 32, which coats a resin, includes a nozzle which drips and coats a liquid photo-curing resin on the surface of the wafer 1. An imaging unit 40 such as a CCD camera (to be referred to as a CCD camera 40 hereinafter) images a resin shaped by the mold 10, and can acquire a color image. At the time of imaging by the CCD camera, a white light source 42 is used for illumination. On the fine motion stage 3, reference marks 50 are laid out on a reference mark table. A controller 100 controls the apparatus to make predetermined operations by controlling the aforementioned actuators and sensors. The controller 100 also serves as a determination unit which determines a shaping quality, as will be described later. A memory 110 stores images acquired by the CCD camera 40.

Figure 3:
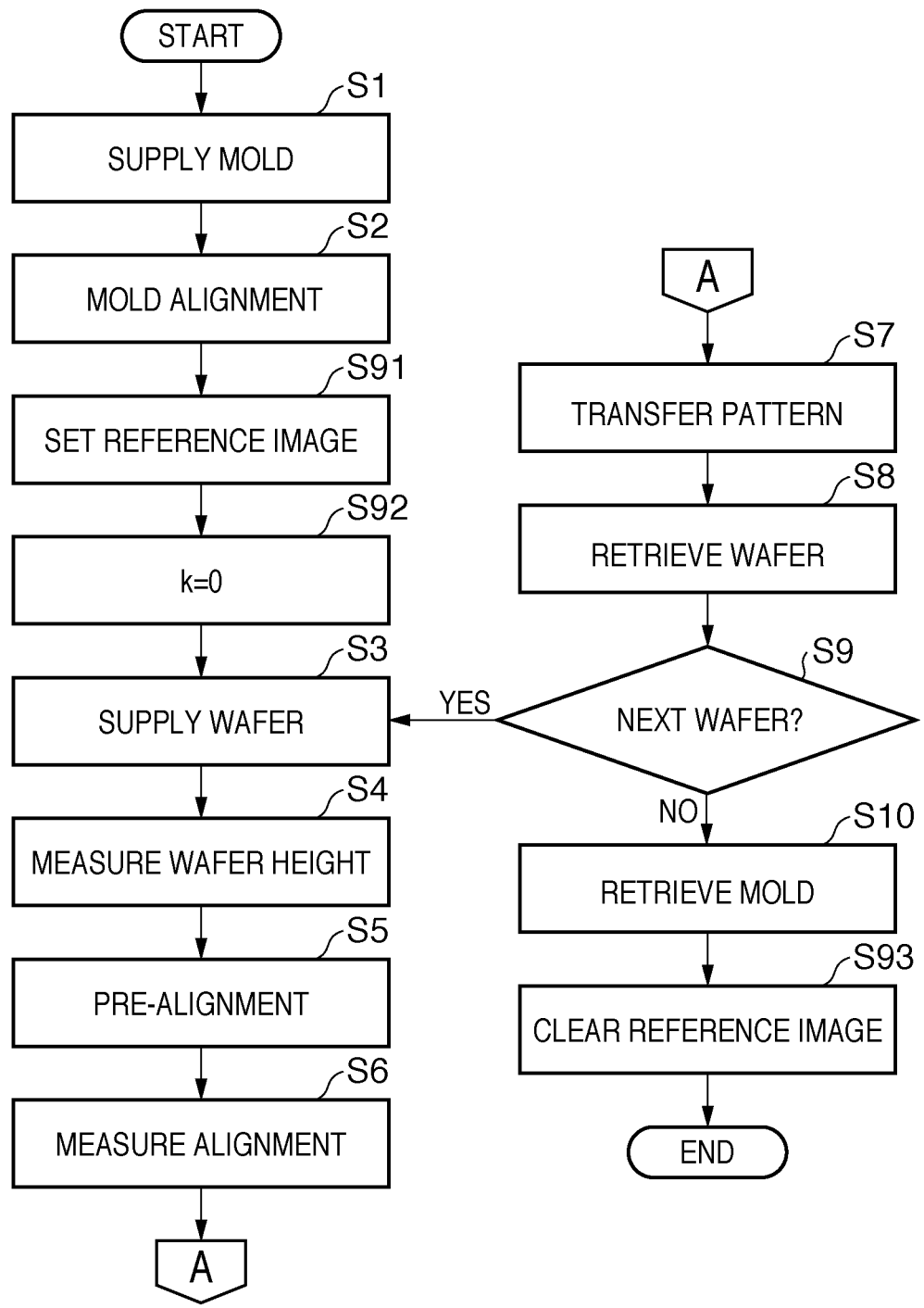
FIG. 3 is a flowchart of a process for transferring a single layer onto a plurality of wafers according to the respective embodiments.

The operations of the imprint apparatus upon manufacturing a semiconductor device will be described below with reference to FIGS. 1 to 4. FIG. 3 is a flowchart of a process for transferring a pattern of a certain layer onto a plurality of wafers using a single mold. In step S1, a mold conveyance mechanism (not shown) supplies the mold 10 to the mold chuck 11. In step S2, the TTM alignment scopes 30 and 30' simultaneously observe the alignment marks (not shown) of the mold 10 and the reference marks 50 on the fine motion stage 3. Using these observation results, the mold chuck stage 12 mainly aligns the position of the mold 10 in the θ (rotation about the z-axis) direction. In step S91, the controller 100 reads out, from the memory 110, a reference image that is set and stored prior to imaging of a shaped resin by the CCD camera 40. The reference image is an image of a resin in a reference state of a shot, which is satisfactorily shaped in advance under imprint conditions at that time, which include a substrate to be used, surface, mold, resin, mold pressing load, mold pressing time, UV irradiation time, and release speed. The reference image may be acquired by simulating a state of a satisfactorily shaped resin in a reference state. In step S92, a continuous defective shot counter k (to be described later) is reset to zero. In step S3, a wafer conveyance mechanism (not shown) supplies the wafer 1 to the wafer chuck 2. In step S4, the XY stage 4 is driven, and the gap sensor 20 measures the height (flatness) of the entire surface of the wafer 1. This measurement data is used to align the transfer shot surface of the wafer 1 to a reference plane (not shown) of the apparatus at the time of pressing of the mold, as will be described later.

In step S5, a pre-alignment measuring device (not shown) images and observes pre-alignment marks (not shown) transferred onto the wafer 1 beforehand. The controller 100 measures shifts of the wafer 1 in the x- and y-directions with respect to the apparatus by image processing, and performs position correction in the θ (rotation about the z-axis) direction based on the measurement result. In step S6, the TTM alignment scopes 30 and 30' simultaneously observe alignment marks (not shown) on the mold 10 and those (not shown) on the wafer 1 on a specific sample measurement shot of the wafer 1. Then, the controller 100 measures relative positional shift amounts in the x- and y-directions. A positional shift in the θ (rotation about the z-axis) direction is also calculated from these positional shifts in the x- and y-directions. Then, based on the measurement results of the TTM alignment scopes on the sample measurement shot, the controller 100 predicts shifts of respective shots on the wafer 1 in the x- and y-directions and θ direction, and decides alignment target positions of the wafer stage upon execution of transfer processes for respective shots. This is the same method as a global alignment measurement method used in a step-and-repeat semiconductor projection exposure apparatus. In step S7, a pattern transfer process based on the flowchart shown in FIG. 4 is made on respective shots on the wafer 1.

Upon completion of the transfer processes for all shots, the wafer conveyance mechanism (not shown) retrieves the wafer 1 from the wafer chuck 2 in step S8. The controller 100 then determines in step S9 whether or not wafers that are to undergo the pattern transfer process still remain. If wafers that are to undergo the transfer process still remain, the process returns to step S3; otherwise, the process advances to step S10. In step S10, the mold conveyance mechanism (not shown) retrieves the mold 10 from the mold chuck 11. Finally, in step S93, the reference image is cleared, thus ending the pattern transfer processes for the plurality of wafers.

Figure 4:
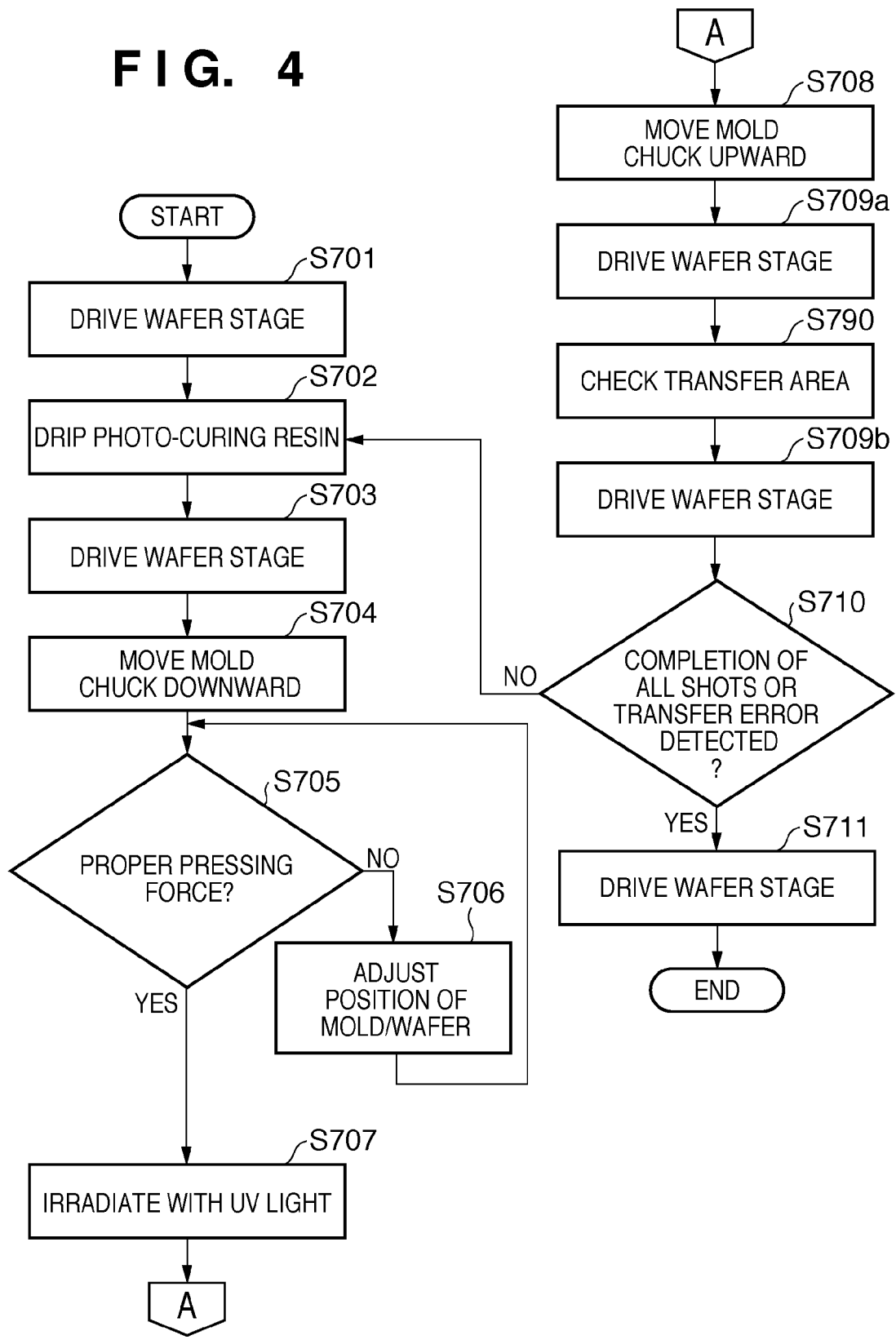
FIG. 4 is a flowchart of a process for transferring a pattern onto a single wafer according to the first embodiment.

FIG. 4 is a flowchart of the process executed when a pattern is transferred onto a single wafer using the imprint apparatus according to the first embodiment of the present invention, and corresponds to step S7 in FIG. 3. The operations, functions, and the like of the imprint apparatus according to the first embodiment will be described below with reference to FIG. 4 and FIGS. 1 and 2. Referring to FIG. 4, the controller 100 drives the XY stage 4 to move the wafer chuck 2 on which the wafer 1 is placed, so as to locate a pattern transfer location (shot) on the wafer 1 to a position under the dispenser head 32 in step S701. In step S702, the dispenser head 32 coats a target shot on the wafer 1 with a photo-curing resin. In step S703, the controller 100 drives the XY stage 4 to locate a plane of the shot of interest at a position facing a concave-convex pattern of the mold 10. In this case, the wafer stage is moved to the alignment target position, which is decided and corrected based on the alignment measurement results in step S6 in FIG. 3. Furthermore, the controller 100 adjusts the height and tilt of the wafer chuck 2 in the z-direction using the fine motion stage 3, and aligns the surface of the shot on the wafer 1 to the reference plane (not shown) of the apparatus based on the aforementioned measurement data of the wafer height. In step S704, the controller 100 drives the linear actuators 15 and 15' to move the mold chuck 11 downward to a predetermined position. The controller 100 determines in step S705 based on the outputs from the load cells 21 (not shown in FIG. 1) attached to the mold chuck 11 or mold chuck stage 12 whether or not the pressing force of the mold 10 assumes a proper value. If the pressing force falls outside a predetermined range, NO is determined in step S705, and the process advances to step S706.

In step S706, the controller 100 adjusts the pressing force of the mold 10 by changing the position of the mold chuck 11 in the z-direction using the linear actuators 15 and 15' or changing the position of the wafer chuck 2 in the z-direction using the fine motion stage 3. The controller 100 repeats a loop of steps S705 and S706 until a predetermined pressing force is obtained. If it is determined in step S705 that the pressing force of the mold 10 is proper, YES is determined in step S705, and the process advances to step S707. In step S707, the UV light source 16 irradiates the shot with UV light for a predetermined period of time. Upon completion of the UV light irradiation, the controller 100 drives the linear actuators 15 and 15' to move the mold chuck 11 upward in step S708, thus removing the mold 10 from the cured resin on the wafer 1. In step S709a, the controller 100 drives the XY stage 4 to move the wafer 1, so that the shot after transfer is located at a position under the CCD camera 40.

In step S790, the controller 100 performs quality determination of the shot after transfer according to the flowchart shown in FIG. 5. Referring to FIG. 5, the white light source 42 irradiates the shot after transfer with white light, and the CCD camera 40 images a state of the resin of the shot after transfer in step S791. In step S792, the controller 100 compares the reference image set in step S91 in FIG. 3 and the image acquired in step S791. As a comparison target, at least a partial area of the acquired image can be used. When a shaping error is caused by the residual layer thickness unevenness of a resin, since it often extends over the entire shot, the entire acquired image is used as a comparison target in this case. On the other hand, when a shaping error is caused by the presence of dust, it may remain on a partial area of the shot. In this case, a partial area of the acquired image is used as a comparison target.

The controller 100 determines in step S793 whether or not a difference between the resin image in the imaged shot and the reference image falls outside an allowable range. More specifically, this determination process is implemented using a phenomenon in that when the resin bites dust or it suffers the residual layer thickness unevenness, a change in color tone is observed in the acquired image. For example, a determination method of comparing a histogram of the acquired image with that of the reference image can be used. This method is disclosed in Japanese Patent Laid-Open No. 10-336506. That is, this method uses a degree of correlation between color difference histograms. For example, when the degree of correlation of a color difference histogram of the image after transfer with respect to that of the reference image is 90% or less, a transfer error is determined. Also, a determination method using the number of pixels corresponding to differences, which exceed a reference value, between the acquired image and reference image, can be used. Furthermore, the above determination process can be implemented based on a relative distance between two images on an XYZ color system. When the relative distance of the shot image after transfer is separated by a predetermined value or more with respect to the reference image, the controller 100 determines a transfer error. As the predetermined value, a MacAdam's deviation ellipse on the XYZ color system can be used. For example, when the shot image after transfer is located outside the MacAdam's deviation ellipse with respect to the reference image on the XYZ color system, a transfer error may be determined. Japanese Patent No. 3811728 discloses a method of measuring the film thickness of a thin film using the XYZ color system. However, the present invention does not require any calculations of the film thickness itself.

In this way, if the difference between the reference image and the shot image after transfer falls outside the allowable range, NO is determined in step S793, and the process advances to step S795. In step S795, the controller 100 counts up the continuous defective shot counter k by 1. The controller 100 determines in step S796 whether or not the count value of the continuous defective shot counter k is 3 as a predetermined count value. This is because transfer errors less than three continuous shots are not determined as transfer errors in consideration of a so-called self cleaning effect of the mold. If the continuous defective shot count reaches 3, YES is determined in step S796, and the process advances to step S797. In step S797, the controller 100 outputs a signal which instructs to retrieve the substrate determined as a defective substrate or to exchange the mold. For example, the controller 100 displays a message indicating that a transfer error has occurred on an operation screen of the apparatus (not shown). In this case, the controller 100 may be configured to output a message that instructs to retrieve the substrate determined as a defective substrate or to exchange the mold. On the other hand, if the count value of the continuous defective shot counter k is not 3, NO is determined in step S796, thus ending the flowchart (step S790 in FIG. 4) shown in FIG. 5. If the difference between the reference image and shot image after transfer falls within the allowable range, YES is determined in step S793, and the continuous defective shot counter k is reset to zero in step S794. After that, the flowchart shown in FIG. 5 ends.

In this way, when the number of shots continuously determined as defective shots is less than 3, it is determined that dust has been removed by the self cleaning effect, and a transfer error of the entire wafer is not determined. When discontinuous transfer errors less than three shots have occurred, a host apparatus (not shown), which controls the imprint apparatus, is informed of shot numbers together with an identification number of the wafer of interest (e.g., called a wafer ID). Then, management of transfer histories of wafers and inspections using, for example, a pattern inspection apparatus after transfer can be facilitated. Note that the value used to determine the number of continuous defective shots in step S796 is not limited to 3, and can be changed as needed according to transfer conditions. In this way, step S790 of performing transfer quality determination in FIG. 4 is executed.

Referring back to FIG. 4, after step S790, the controller 100 drives the XY stage 4 to move the wafer 1 so that the next shot which is to undergo the transfer process is located at a position under the dispenser head 32 in step S709b. The controller 100 determines in step S710 whether the pattern transfer processes of all shots on the wafer 1 are complete or transfer errors are detected. If shots which are to undergo the transfer process still remain, and no transfer error is detected, NO is determined in step S710, and the process returns to step S702. If no shot which is to undergo the transfer process remains or transfer errors are detected, YES is determined in step S710, and the process advances to step S711. In step S711, the controller 100 drives the XY stage 4 to a predetermined position to prepare for retrieval of the wafer 1 (step S8 in FIG. 3).

Figure 6:
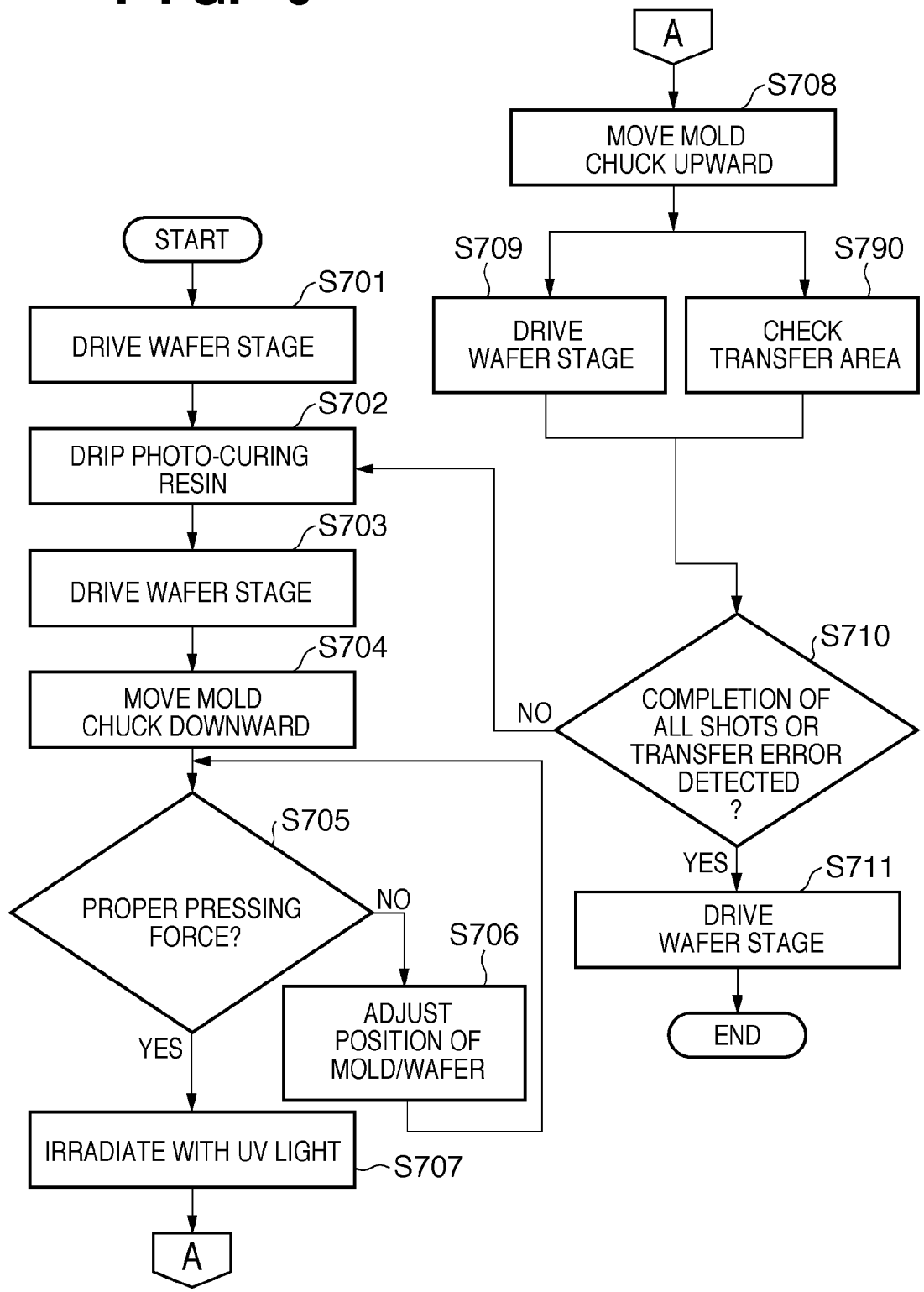
FIG. 6 is a flowchart of another process for transferring a pattern onto a wafer according to the first embodiment.

The operations and functions of the imprint apparatus upon transferring a pattern on a single wafer have been described above using FIG. 4. Note that when transfer errors are detected in FIG. 4, the mold may be automatically retrieved from the imprint apparatus and may be cleaned or exchanged in consideration of attachment of dust. In this way, the continuous transfer processes for a single wafer or the transfer processes for another wafer are ready. In FIG. 1, the CCD camera 40 and white light source 42 are laid out on the side opposite to the dispenser head 32 across the mold 10 for the sake of simplicity, but they may be laid out on the same side with respect to the mold 10. In this case, the moving amounts of the XY stage 4 in steps S709a and S709b can be reduced. Furthermore, as shown in FIG. 6, after step S708, step S790 of performing transfer quality determination may be executed parallel to step S709 of moving the wafer 1 so that the next shot which is to undergo the transfer process is located at the position under the dispenser head 32. In this case, in step S791 in FIG. 5, the shot after transfer is imaged during movement of the XY stage 4. In this manner, since the XY stage 4 need not be stopped for imaging, the throughput can be improved.

[Second Embodiment]

Figure 7:
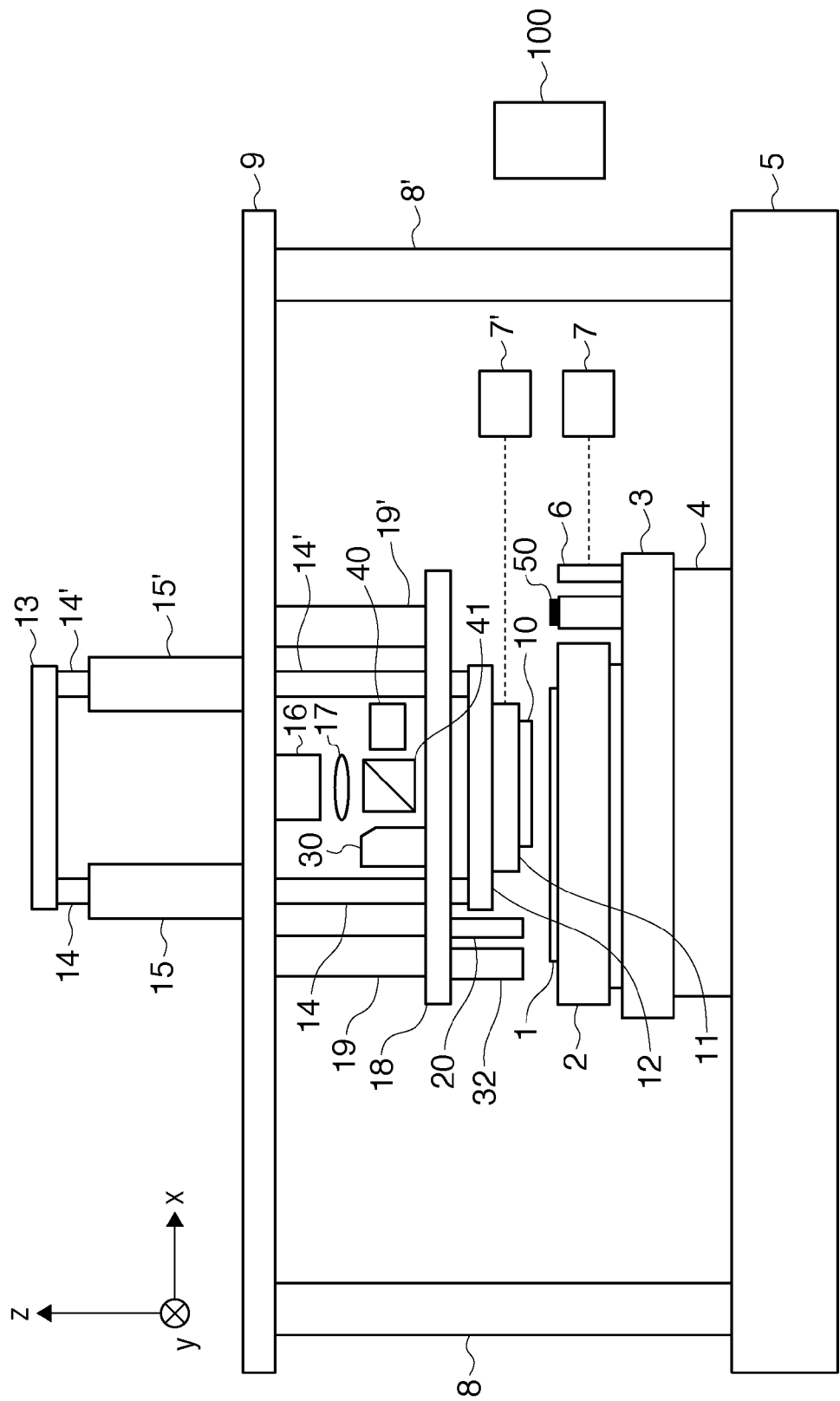
FIG. 7 is a view showing the arrangement of an imprint apparatus according to the second embodiment.
Figure 8:
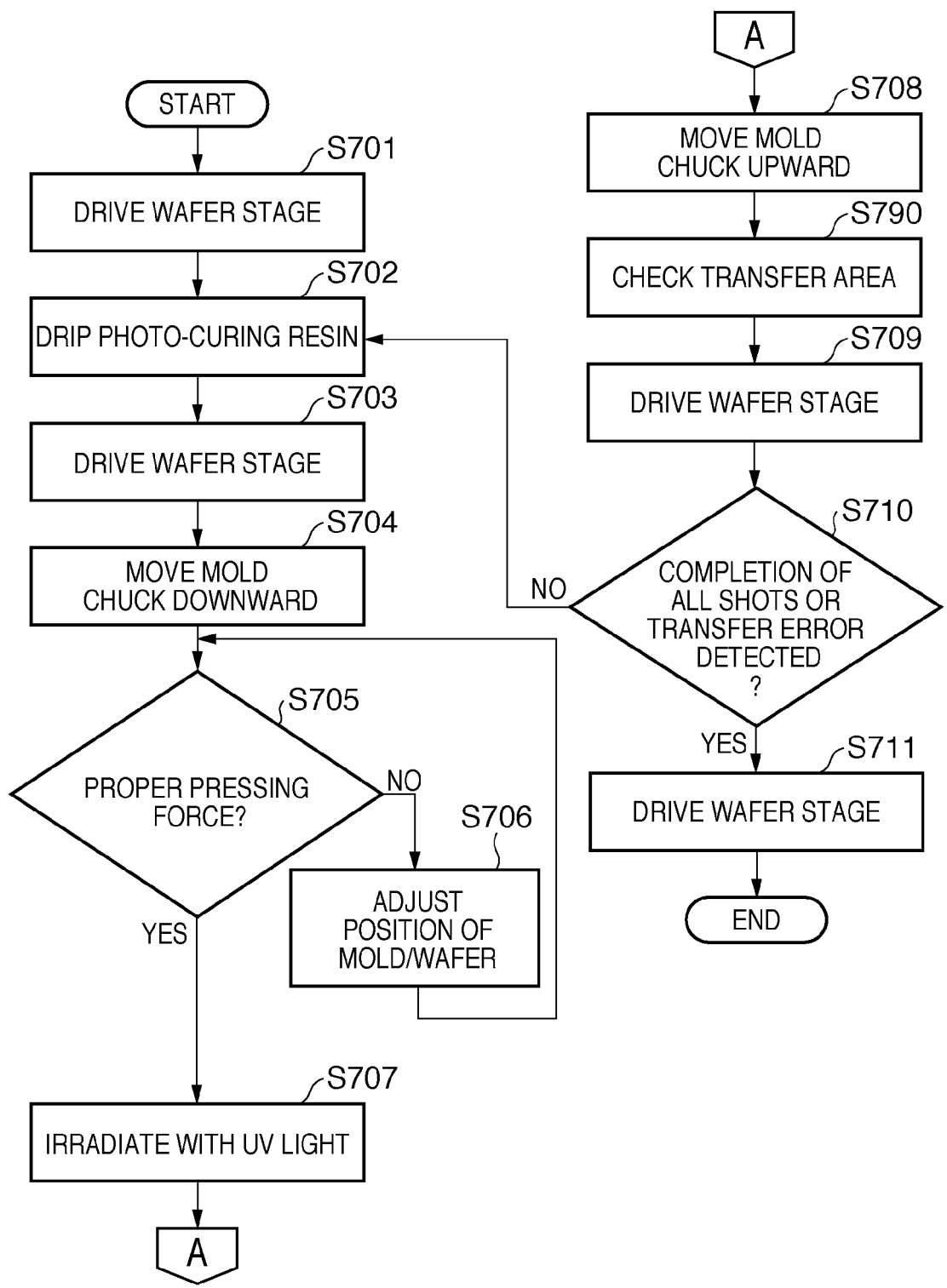
FIG. 8 is a flowchart of a process for transferring a pattern onto a single wafer according to the second embodiment.

The operation, functions, and the like of an imprint apparatus according to the second embodiment will be described below with reference to FIG. 7. The same reference numerals in FIG. 7 denote components having the same functions as in FIG. 1, and a description thereof will not be repeated. Referring to FIG. 7, reference numeral 41 denotes a beam splitter, which is arranged in an optical path from a UV light source 16, and guides reflected light coming from the side of a wafer 1 via a mold 10 toward a CCD camera 40 by bending the light. For the sake of simplicity, FIG. 7 does not illustrate one TTM alignment scope 30'. A flowchart of a process for transferring a pattern of certain layer onto a plurality of wafers using a single mold is the same as FIG. 3. FIG. 8 is a flowchart of a process for transferring a pattern on a single wafer using the imprint apparatus of the second embodiment, and corresponds to step S7 in FIG. 3. The same step numbers in FIG. 8 denote the steps of performing the same operations as in FIG. 4, and a description thereof will not be repeated.

The operations, functions, and the like of the imprint apparatus of the second embodiment will be described below with reference to FIGS. 7 and 8 and FIG. 2. FIG. 8 is different from FIG. 4 in that step S790 of performing transfer quality determination is executed immediately after releasing in step S708. In this case, the light source 16, which can selectively emit first light (UV light) of a wavelength range required to cure a resin, and second light (white light) of a wavelength range different from the former wavelength range, can be used. For example, assume that the light source 16 is a multi-wavelength light source, and incorporates a wavelength selection filter (not shown). Upon irradiating an ultraviolet-curing resin with UV light to cure that resin in step S707, the resin is irradiated with only UV light via the wavelength selection filter. After the release, when the shot after transfer is imaged in step S791 in FIG. 5, the UV light source 16 irradiates the shot with white light by removing an ultraviolet range by the wavelength selection filter. Light reflected by the ultraviolet-curing resin on the wafer 1 is bent by the beam splitter 41 toward the CCD camera 40, and is imaged as an image of the shot after transfer. In FIG. 8, other operations are the same as those in FIG. 4, and a description thereof will not be repeated.

Figure 9:
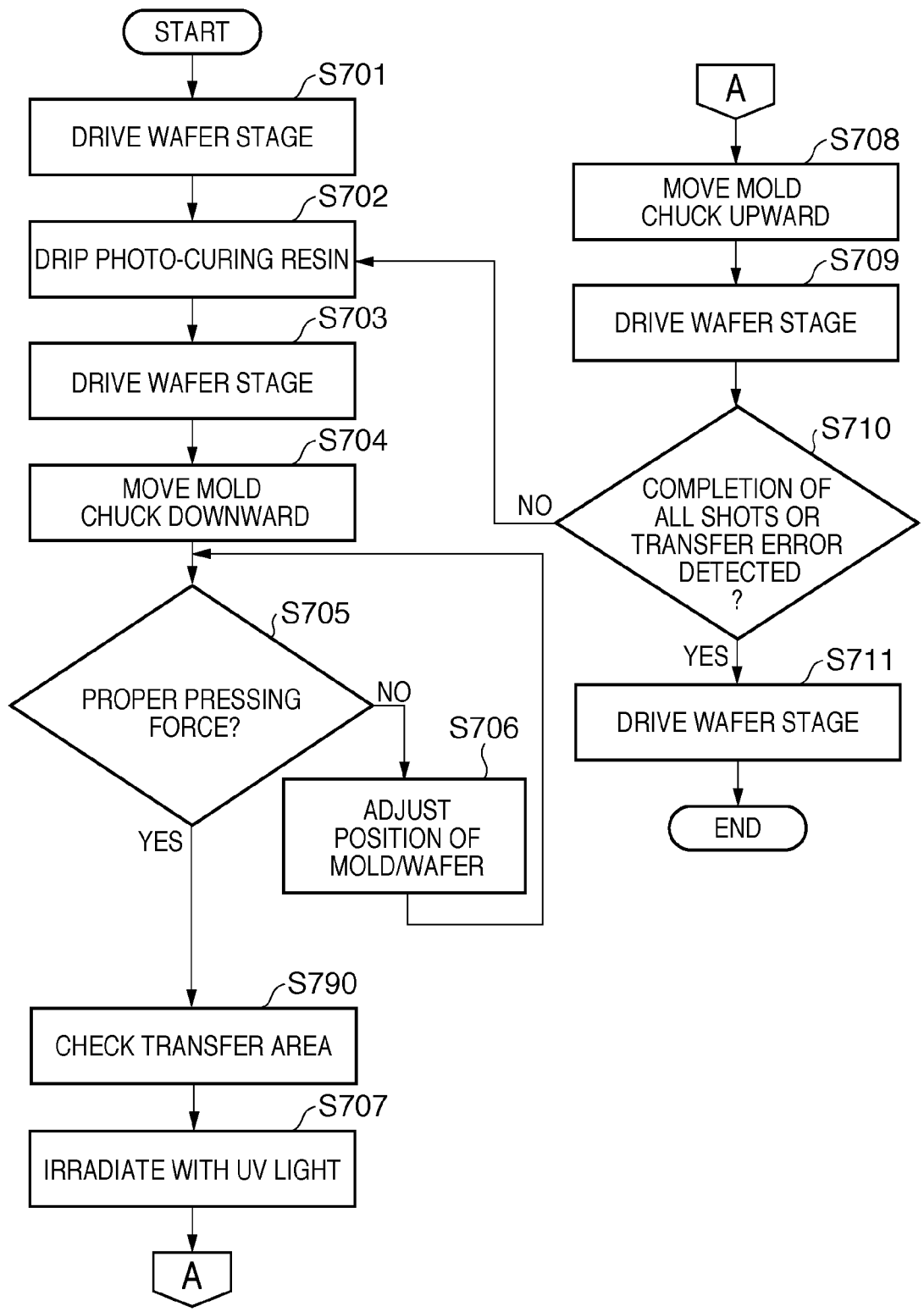
FIG. 9 is a flowchart of another process for transferring a pattern onto a wafer according to the second embodiment.

FIG. 9 is a flowchart of another process for transferring a pattern on a single wafer using the imprint apparatus of the second embodiment, and corresponds to step S7 in FIG. 3 as in FIG. 8. The same step numbers in FIG. 9 denote the steps of performing the same operations as in FIG. 4, and a description thereof will not be repeated. The operations, functions, and the like of the imprint apparatus of the second embodiment will be described below with reference to FIGS. 7 and 9 and FIG. 2. FIG. 9 is different from FIG. 8 in that step S790 of performing shaping quality determination is executed before UV light irradiation in step S707. In this case, the light source 16 is a multi-wavelength light source which incorporates a wavelength selection filter (not shown), as described above. In step S791 in FIG. 5, the light source 16 irradiates an ultraviolet-curing resin with white light so as to image the state of the shaped ultraviolet-curing resin before curing. That is, the light source 16 irradiates the resin with white light except for an ultraviolet range while the mold 10 is pressed against the resin at a predetermined pressing force, and a transfer area is imaged by the CCD camera 40. Even before the resin is cured, if there is a residual layer thickness unevenness or dust, it can be observed in the same manner as that after the resin is cured. Therefore, in FIG. 9, immediately after the transfer area is checked in step S790, transfer quality determination is performed. If an error is determined, the wafer can be retrieved before UV light irradiation. In this connection, a reference image used in the transfer quality determination in case of FIG. 9 uses an image before UV light irradiation when dust or errors are fewest and the result after transfer is satisfactory.

As described above, in the second embodiment, since the need for moving an XY stage for the purpose of imaging a transfer area by the CCD camera 40 can be obviated, the throughput of the apparatus can be improved. Also, since the layout of the CCD camera 40 with respect to the dispenser head 32 is free from any restriction, degrees of freedom in design of the apparatus can be enhanced.

As described above, according to the present invention, an imprint apparatus which detects a defective shot during pattern transfer for one substrate, and can prevent the number of defective shots from increasing upon transferring a pattern onto a plurality of shots on a substrate can be provided. Therefore, an imprint apparatus that can assure a high yield can be provided. Since the transfer quality is determined by comparing with an image which is transferred and stored in advance under the same conditions, the transfer quality can be normally determined even when a pattern structure of a mold to be used has changed.

[Method of Manufacturing Article]

A method of manufacturing devices (a semiconductor integrated circuit element, liquid crystal display element, and the like) as an article includes a process for transferring (forming) a pattern on a substrate (a wafer, glass plate, or film-like substrate) using the aforementioned imprint apparatus. Furthermore, the manufacturing method can include a process for etching the substrate on which the pattern is transferred. Note that upon manufacturing other articles such as patterned media (recording media) or optical elements, the manufacturing method can include other process for processing the substrate on which the pattern is transferred in place of etching.

The embodiments of the present invention have been described. The present invention is not limited to these embodiments, and various modifications and changes can be made within the scope of its general inventive concept.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-143670, filed Jun. 16, 2009, which is hereby incorporated by reference herein in its entirety.

What is claimed is:

1. An imprint apparatus, which performs an imprint process for forming a pattern of a mold on a resin supplied on a substrate to form patterns on a plurality of shots on the substrate, the apparatus comprising:
   an imaging unit configured to image the resin formed with the pattern;
   a mold chuck configured to hold the mold;
   a resin supplying unit configured to supply resin onto the substrate; and
   a controller configured to control the imprint process,
   wherein said imaging unit is laid out on a same side as said resin supplying unit with respect to a position where said mold chuck is laid out so that said imaging unit images the resin formed with the pattern without imaging through the mold, and
   wherein said controller compares an image of the resin formed with the pattern imaged by said imaging unit and an image of a reference state to determine a quality of a pattern formed on the plurality of shots.

2. The apparatus according to claim 1, wherein said controller compares a histogram of the image of the resin formed with the pattern and a histogram of the image of the reference state.

3. The apparatus according to claim 1, wherein said controller determines a transfer error of the pattern formed on the resin based on the number of pixels corresponding to differences, which exceed a reference value, between the image of the resin formed with the pattern and the image of the reference state.

4. The apparatus according to claim 1, wherein said controller determines a transfer error when patterns falling outside an allowable range are formed a predetermined number of times.

5. The apparatus according to claim 1, wherein when said controller determines a transfer error, said controller outputs a signal which instructs to retrieve the substrate determined as the transfer error or to exchange the mold.

6. The apparatus according to claim 1, further comprising:
   a light source configured to alternatingly emit a first light of a wavelength range required to cure the resin, and a second light of a wavelength range different from the wavelength range of the first light,
   wherein said imaging unit images the resin while the resin is irradiated with the second light.

7. The apparatus according to claim 1, wherein said imaging unit images the resin on which the pattern is formed before the resin is cured.

8. A method of manufacturing an article, the method comprising:
   forming a pattern on a substrate using an imprint apparatus, which forms a pattern on a substrate by performing an imprint process including shaping of a resin supplied on a substrate using a mold to form patterns on a plurality of shots on the substrate; and
   processing the substrate on which the pattern is formed,
   wherein the imprint apparatus comprises:
   an imaging unit configured to image the resin formed with the pattern; and
   a mold chuck configured to hold the mold;
   a resin supplying unit configured to supply resin onto the substrate; and
   a controller configured to control the imprint process,
   wherein the imaging unit is laid out on a same side as the resin supplying unit with respect to a position where the mold chuck is laid out so that the imaging unit images the resin formed with the pattern without imaging through the mold, and
   wherein the controller compares an image of the resin formed with the pattern imaged by the imaging unit and an image of a reference state to determine a quality of a pattern formed on the plurality of shots.

9. The apparatus according to claim 1, wherein every time a pattern is formed on each of the plurality of shots, said controller determines a quality of the pattern formed on each of the plurality of shots.

10. The apparatus according to claim 1, wherein after the mold is removed from the cured resin, said imaging unit images the resin formed with the pattern by the mold while a substrate stage, which holds the substrate, moves so that the next shot, onto which a pattern is to be transferred, is located at a position under said resin supplying unit.

11. An imprint apparatus, which performs an imprint process for forming a pattern of a mold on a resin supplied on a substrate to form patterns on a plurality of shots on the substrate, the apparatus comprising:
   an imaging unit configured to image the resin formed with the pattern;
   a mold chuck configured to hold the mold;
   a resin supplying unit configured to supply resin onto the substrate; and
   a controller configured to control the imprint process,
   wherein the imaging unit is laid out on a same side as said resin supplying unit with respect to a position where said mold chuck is laid out, and images the resin formed with the pattern after the mold is removed from the cured resin, and
   wherein said controller determines a quality of the pattern formed on the plurality of shots based on the image of the resin formed with the pattern imaged by said imaging unit.

12. The apparatus according to claim 11, wherein said controller compares an image of the resin formed with the pattern imaged by said imaging unit and an image of a reference state to determine a quality of a pattern formed on the plurality of shots.

13. An imprint apparatus, which performs an imprint process for forming a pattern of a mold on a resin supplied on a substrate to form patterns on a plurality of shots on the substrate, the apparatus comprising:
   an imaging unit configured to image the resin formed with the pattern;
   a mold chuck configured to hold the mold;
   a resin supplying unit configured to supply resin onto the substrate; and
   a controller configured to control the imprint process,
   wherein the imaging unit is laid out laterally opposite to the resin supplying unit in relation to the mold chuck, and
   wherein said controller determines a quality of a pattern formed on the plurality of shots based on the image of the resin formed with the pattern imaged by said imaging unit.

14. The apparatus according to claim 13, wherein said controller compares an image of the resin formed with the pattern imaged by said imaging unit and an image of a reference state to determine a quality of a pattern formed on the plurality of shots.

15. The apparatus according to claim 14, wherein said controller performs processing for exchanging the mold or cleaning the mold after the quality of the pattern was continuously determined as a transfer error a predetermined number of times.

16. An imprint apparatus, which performs an imprint process for forming a pattern of a mold on a resin supplied on a substrate to form patterns on a plurality of shots on the substrate, the apparatus comprising:

an imaging unit configured to image the resin formed with the pattern;

a substrate stage configured to hold the substrate;

a resin supplying unit configured to supply resin onto the substrate; and a controller configured to control the imprint process, wherein after the mold is removed from the cured resin, the imaging unit images the resin formed with the pattern while the substrate stage moves so that the next shot, onto which a pattern is to be transferred, is located at a position under said resin supplying unit, and wherein said controller determines a quality of a pattern formed on the plurality of shots based on the image of the resin formed with the pattern imaged by said imaging unit.

17. An imprint apparatus, which performs an imprint process for forming a pattern of a mold on a resin supplied on a substrate to form patterns on a plurality of shots on the substrate, the apparatus comprising:

an imaging unit configured to image the resin formed with the pattern; and a controller configured to control the imprint process, wherein said controller determines a quality of a pattern formed on the plurality of shots based on the image of the resin formed with the pattern imaged by said imaging unit, wherein said controller performs the imprint process after the quality of the pattern was determined as satisfactory, and wherein said controller stops the imprint process after the quality of the pattern was continuously determined as a transfer error a predetermined number of times.

* * * * *